United States Patent [19]
Wood et al.

[11] Patent Number: 5,145,099
[45] Date of Patent: * Sep. 8, 1992

[54] METHOD FOR COMBINING DIE ATTACH AND LEAD BOND IN THE ASSEMBLY OF A SEMICONDUCTOR PACKAGE

[75] Inventors: Alan G. Wood; Warren M. Farnworth; George P. McGill, all of Boise, Id.

[73] Assignee: Micron Technology, Inc., Boise, Id.

[*] Notice: The portion of the term of this patent subsequent to Nov. 5, 2008 has been disclaimed.

[21] Appl. No.: 787,843

[22] Filed: Nov. 4, 1991

Related U.S. Application Data

[63] Continuation-in-part of Ser. No. 553,099.

[51] Int. Cl.$^5$ ................................................ B23K 3/08
[52] U.S. Cl. ........................................ 228/9; 228/102; 228/105
[58] Field of Search ................ 228/102, 105, 179, 4.5, 228/6.2, 9

[56] References Cited

U.S. PATENT DOCUMENTS

5,062,565 11/1991 Wood et al. .............................. 228/9

Primary Examiner—Samuel M. Heinrich
Attorney, Agent, or Firm—Wayne E. Duffy

[57] ABSTRACT

An improved system for the production of semiconductor devices is described. The invention incorporates conventional die attach and lead bond means into a simplified, common machine system. An independently mounted, computer-controlled, television camera system observes, monitors, and controls the operational steps of the die attach-lead bond process using a close loop process. The invention serves to increase throughout and yields while reducing variation of the finished product.

9 Claims, 4 Drawing Sheets

METHOD FOR COMBINING DIE ATTACH AND LEAD BOND IN THE ASSEMBLY OF A SEMICONDUCTOR PACKAGE

CROSS REFERENCE TO RELATED APPLICATION

This application is a continuation-in-part of Ser. No. 553,099 filed Jul. 13, 1990, now U.S. Pat. No. 5,062,565.

FIELD OF THE INVENTION

The present invention relates to the die attaching and lead bonding steps required to assemble a semiconductor package in the semiconductor and microcircuit manufacturing industry. The invention described integrates and simplifies the conventional steps taken during the manufacturing process.

BACKGROUND OF THE INVENTION

Conventional methodology in the semiconductor and microcircuit industries commonly employs physically separate, complex, and automated machine systems for the die attaching step and for the lead bonding step in the assembly of a semiconductor package.

Figure 1:
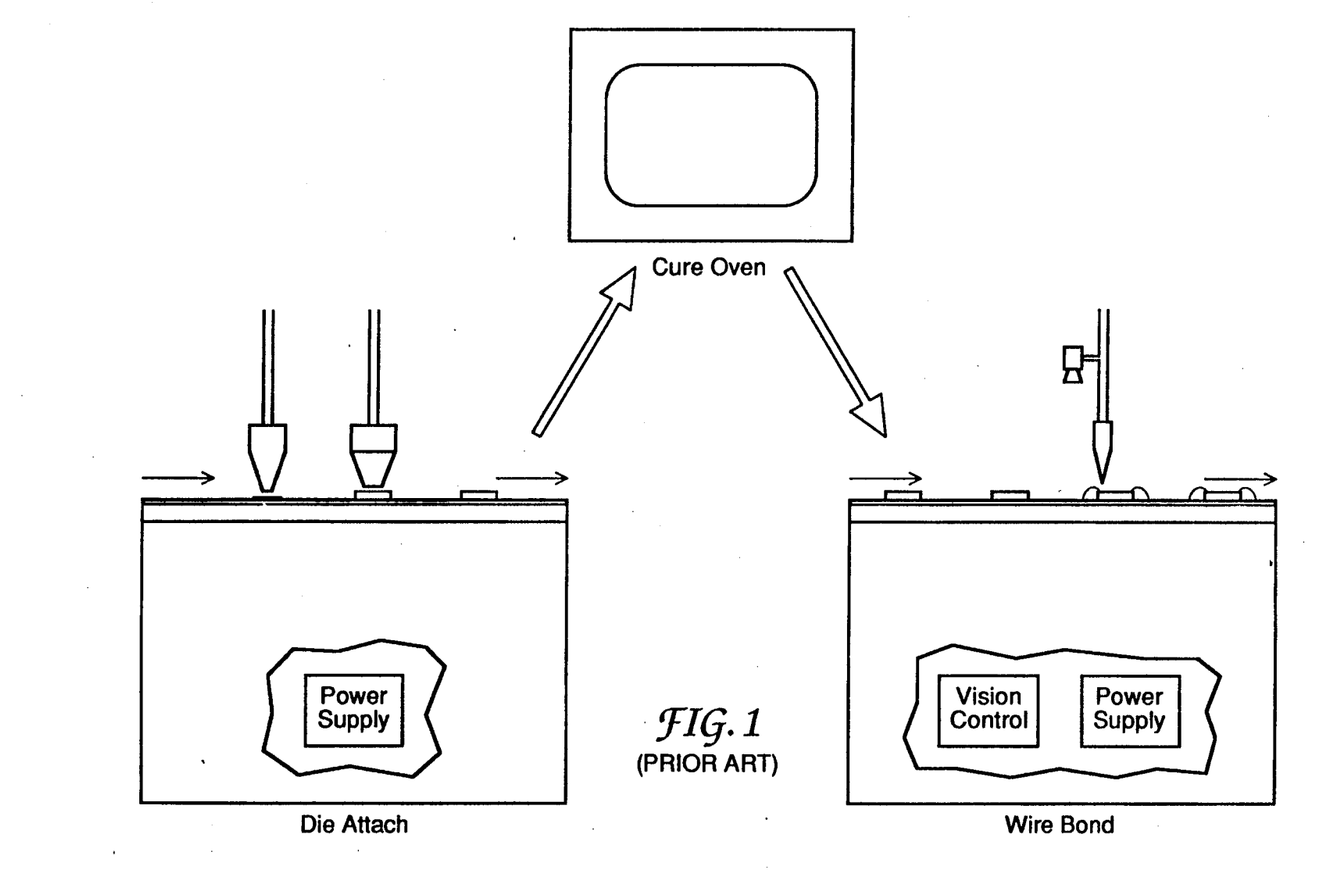
FIG. 1 is a partially cutaway schematic diagram of a conventional die attach and wire bond process using a separate cure oven.

One current manufacturing technology, which utilizes a lead frame handling device, accomplishes die attach in a number of different ways which include, but are not limited to the following:

1. Epoxy Paste—dispensed paste on a leadframe area is located beneath a die that is held by a surface contact tool or an edge contact only tool (collet). The die is lowered into the epoxy and is pressed down long enough to insure adhesion. X-Y movement (scrub) is sometimes used to increase adhesion and speed the process. This process requires a follow-on cure in a separate cure oven as shown in FIG. 1.

2. Epoxy Film—an epoxy film is dispensed on a leadframe area and the die is lowered down to the film surface. Bonding is accomplished with pressure. This process requires a follow-on cure in a separate cure oven as shown in FIG. 1.

3. Epoxy Film on Tape—an epoxy film that is applied to both sides of a supporting tape is dispensed on a leadframe area. Remaining steps are as in Epoxy Film, above.

4. Thermoplastic Film—a film with thermoplastic adhesive on both sides of the film is attached to the leadframe. The frame with the film attached is presented below the die and the die is attached using controlled force and temperature. Scrub of small magnitude may be used. This method does not require follow-up cure.

5. Thermoplastic Tape—a piece of thermoplastic material is attached and bonded as in the Thermoplastic Film method.

6. Eutectic—metal with a low melting temperature is dispensed onto the leadframe area. A die is placed on the dispensed metal. Adhesion is obtained by an intermixing of the die backside and the metal. Controlled pressure, scrub, and temperature are used. No follow-on cure is required.

7. Soft Solder—same process as in Eutectic except that the metal does not mix with the backside material.

8. Glue—a conductive or non-conductive glue can be used as required. The glue would normally be quick set with no follow-on cure required.

A relevant and now common method, area wire bond (A-wire), will be described. The A-wire process, which complements mechanical, thermal, and electrical device performance functions, is applied to surface mount multiple lead integrated circuits to form an internal plastic package construction. Typical discussions of current IBM area wire bond techniques may be found in U.S. Pat. No. 4 862,245, William C. Ward, et al., and in article in IEEE Journal, March, 1988, pp 552–557, by William C. Ward, entitled, in part, "Volume Production of Unique Plastic Surface-mount Modules . . . by area Wire Bond Techniques".

Briefly, in the conventional IBM A-wire process two highly automated machines are used. First, a die attach machine lays down a thermoset film, which has a heat-activated adhesive on each side, to the central area of a lead frame. A die is then bonded to the film in a way which allows wires to be attached to bond pads on the die which are exposed by "via-holes" in the film. The part is then moved to an oven for tape cure. After tape cure the material is transferred to the wirebonder machine where fine wires are attached which connect the die pads to the individual leads on the frame. The sequence is described in more detail immediately below:

1. A lead frame is inserted into the transport track of the die attacher.

2. The leadframe is moved or "indexed" to a location where an accurately cut piece of thermoset film is attached precisely to the bottom side of the lead frame. The film is attached using a thermode for the controlled application of heat and pressure.

3. The lead frame, with the film firmly laminated to the bottom of the leads, is indexed into position for the die bonding.

4. A die is mechanically picked out of a tray known as a "waffle pack" and is precisely positioned below the film bonded area of the leads on the lead frame. The die attach system must be able to move the die in the X, Y, and Z and Θ (Theta) axes with a high control accuracy.

5. When the die is successfully registered, another thermode is used to attach the die to the film by the controlled use of heat and mechanical force. A die is successfully registered when the circuitry on the face of the die aligns with the film to cover the memory array and provide access for bonding through "via-holes".

6. The lead frame is indexed to a bonding position known as the post die attach lamination station. Another thermode securely laminates all of the elements together, effectively creating a single, uniformly-structured package. The heat and force are controlled as before, but with a different profile than used previously.

7. The part is then removed and placed in an oven to cure the tape.

8. The completed part or package is then indexed through the remaining track system and into a carrier for transfer to the wire bonder. Throughout the die attach process, all positioning or indexing movements are mechanical. Precision of the indexing movements is monitored by random visual inspection of the various steps.

Figure 2:
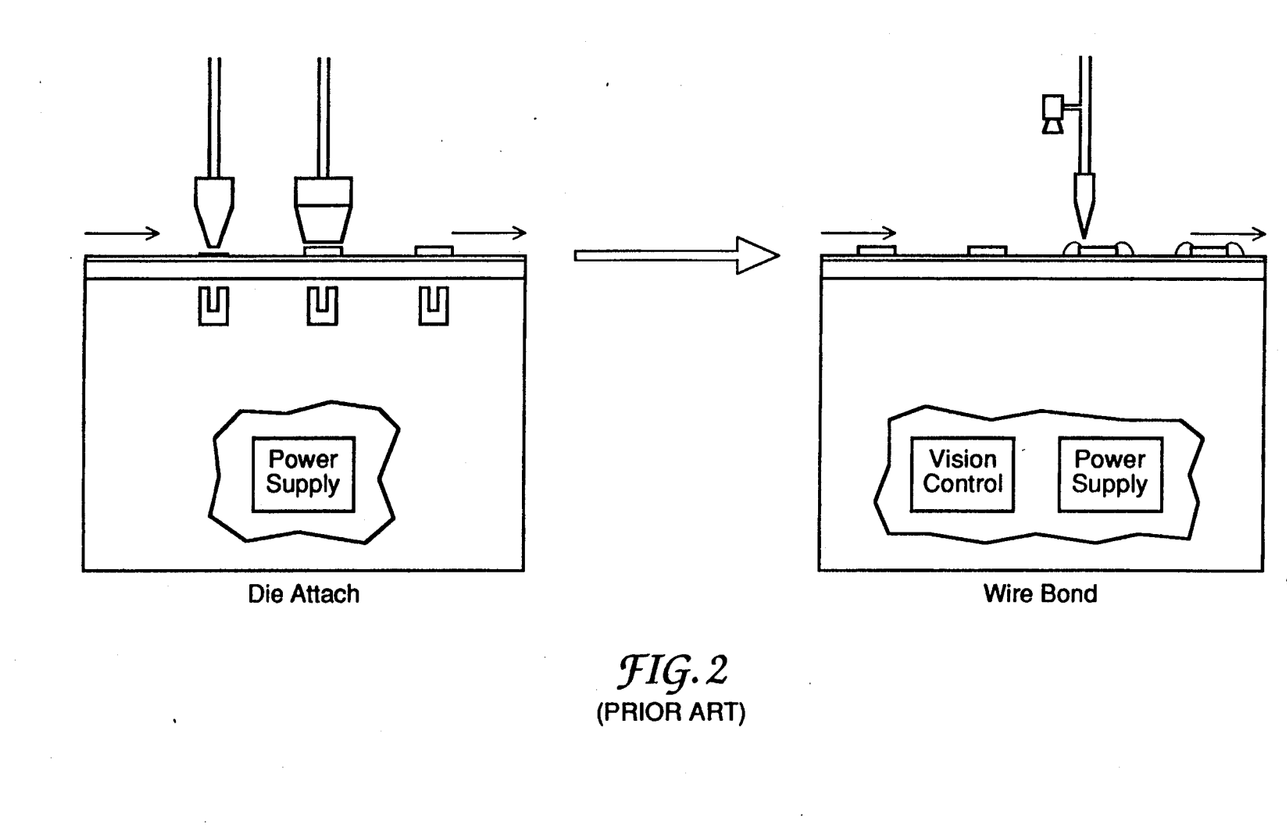
FIG. 2 is a partially cutaway schematic diagram of currently used die attach and wire bond processes which do not use a separate cure oven between the two processes.

9. The carrier containing the lead frames from the die attach machine is transferred manually to the wirebonder for attachment of the fine wires to the leads as shown in FIG. 2.

10. The individual lead frames are indexed into the track of the wirebonder where they are clamped in the bonding position. Wires are then automatically attached from each die pad, in turn, to each lead of the lead frame.

11. Next, the lead frame is indexed out through the track and into another carrier. This carrier is moved off the wirebonder to the next process step or to storage.

To achieve the needed positional accuracy prior to wirebonding, a computer controlled television camera (CCTV), which is attached to the moving bond head, takes a picture of two different areas of the die metallization. This information is transferred to the pattern recognition system, which is a subsystem of the wirebonder. By use of digital circuitry, the actual position of the pattern on the die is established relative to the lead frame.

There is a displacement or "offset" between the capillary position, which contains the wire to be attached, and the line-of-sight needed by the camera to view the die pattern. At each index, when a new location is presented for the bonding operation, the bond head must move to a location that allows the camera to have a clear view of the die pattern. This distance approximates 0.500".

In conventional die attach and wire bond machines the multiple lead frames on the carrier are advanced in a horizontal plane. This is accomplished with multiple index rollers, which rotate continuously about axes above and at right angles to, and in parallel relationship with, the movable horizontal surfaces of the lead frame carriers. The rollers rotate in a direction opposite of the direction of travel of the lead frame carriers. Movement of the carriers is started and stopped by lowering and raising the rollers mechanically to make or release contact with the carriers. When a carrier is stopped in a pre-selected position it is indexed precisely by guide pins located below the horizontal plane of the carrier. When a command is given, the pins move up and engage with the matching holes in the lead frame carrier. The head of the guide pin is generally conical, while the smaller hole in the carrier that matches the guide pin is generally round. Size differences between the pins and holes in the die attach and wire bond machines often allow positional variations of ±0.003" in a particular index location.

Once the wirebond machine starts to work on a die, it will attempt to bond wire to all the die pads which have been programmed into the machine. Modern systems have means to sense many rejectable faults, such as "non-stick" and "no wire". However, some faults can only be detected by visual inspection, such as when ball bonds are partially off the pads.

As mentioned above, some wirebond machines have a CCTV camera attached to the bond head to observe and control the bonding step. Commercial CCTV cameras and monitors are available that can be mounted separately from the bond head. This separate mounting allows the cameras to produce a large image of the part but not be affected by the movement of the bond head. It also increases the accuracy of determining the position of the parts.

It is an intent of this invention to integrate these normally disparate processes into both the die attach and lead bond processes. The die attach-wire bond technology has been discussed in some detail to illustrate clearly the state of the current art and desirability of improved unification and control of the various operation and control parameters commonly involved in the assembly of an integrated circuit package. The procedure to be described hereafter is not limited to conventional die attach-wire bond technologies alone but may, with obvious modifications, be equally applicable to known integrated circuit manufacturing methods, not described here, such as those using a carrier base, tape and reel, printed circuit board multichip modules, flip chip and tape automated bonding and anisotropic Z-axis conductive epoxy film, with appropriate integrated workholder means and material indexing means.

Appropriately integrating these processes in known ways would provide real-time, useful feedback from each process step to the previous and to the following step, thereby improving positioning accuracy and precision while reducing rejectable faults. Additionally, by tying the processes tightly together, the lead bond process validates the successful completion of the die attach, and the optical inspection validates the lead bond step. By using a more sophisticated vision system, information gathered at one process step is available to apply to the next, without the usual problems associated with machine-to-machine manual transfer, communication, or data conversion.

By mounting the vision system statically rather than attaching it to the moving bond head, a significant improvement in accuracy and time savings can be realized at the start of the bond cycle. Feeding the information sensed by the vision system to or from the die attach and lead bonder control systems yields an adaptive, self-regulating assembly system through integration of visual process monitoring into process control.

It is a further intent of this invention to reduce the number of indexing steps required in the die attach and lead bond processes in order to increase the overall quality and quantity of the product and to reduce time and cost of manufacture.

SUMMARY OF THE INVENTION

As mentioned above, the technology of this invention may be applied to integrated circuit assemblies using a carrier base, tape and reel, printed circuit board multichip module, flip chip and tape automated bonding and anisotropic Z-axis conductive epoxy film, not described here, as well as wire bond, but for the purposes of clarity, specificity and brevity, the invention will be described in terms of the common die attach-wire bond technology, as modified by the invention and employed here in the preferred embodiment. Thus qualified, this invention integrates and controls the operations of die attach and lead bond in the following sequence:

1. A lead frame is indexed, in an improved manner to be described, precisely upon the first position of the workholder section of the die attach segment of the integrated die attach-wire bond machine.

2. A precisely cut die-shaped section of polyimide material, sandwiched between an upper and lower layer of thermoplastic adhesive, is precisely pre-attached to the central area of the lead frame by a "pick and place" tool. The pick and place tool is located on an automatically controlled moving arm. The die-shaped material may also be applied directly by a punch mechanism over or under the frame. A thermode is used to produce a controlled temperature which causes a re-flow of the thermoplastic adhesive, thereby attaching the die-shaped section to the lead frame.

3. The lead frame, with the polyimide and thermoplastic material attached, is precisely and mechanically indexed to a second position or "window".

4. The semiconductor device is then "picked out" of the array of the die that constitutes a wafer. The semiconductor device is "placed on" the thermoplastic material, or alternatively, is placed on a "precising" mechanism for attachment to the lead frame from beneath the lead frame. The temperature at this position is higher than at the previous position, thereby softening the thermoplastic material.

5. The lead frame is then indexed to a third, bonding position, known as the post die attach lamination station. Here a third thermode is employed to securely laminate all of the elements together, effectively creating a single, uniformly structured package. The heat and force are controlled as before, but with a different profile than used previously.

At all subsequent process stages a sophisticated and commercially available vision system is used to optically define and recognize the relative position of the lead frame geometry, the outer dimensions of the die, the metallized pattern of the circuitry thereon and the movements at the wire bond stage. This information is stored in the system memory for recall and use as needed.

In this invention, the vision system contains multiple CCTV cameras, each of which is mounted statically and independently from the moving stations of the die attach and lead bond processes. Each camera is positioned to continuously view a specific series of process steps, particularly the completed die attach process and the entire lead bond process. The information from each camera is integrated into a common memory system and used to observe and control the overall fabrication procedure.

6. The lead frame is indexed again to the fourth position or "window" where another mechanical arm, known as an X, Y, Z motion bondhead, is positioned to attach fine wires from the die pads to the appropriate leads on the lead frame. The information in a second camera system memory is used to correct displacement errors from the programmed combination of die-to-lead frame dimensions.

7. Having attached the wires between the pads and leads, the system then indexes the lead frame out of the elevated temperature zone to an additional window. At this additional window a third camera makes a comparison of the just-bonded device to a "recipe" of allowed positional displacements. If any of the elements are outside the allowed tolerance, the entire process is interrupted and processing stops until corrections are made.

8. If no processing errors are found which justify rejection of the part it is indexed out to a carrier and moved to the next process or to storage.

Figure 4:
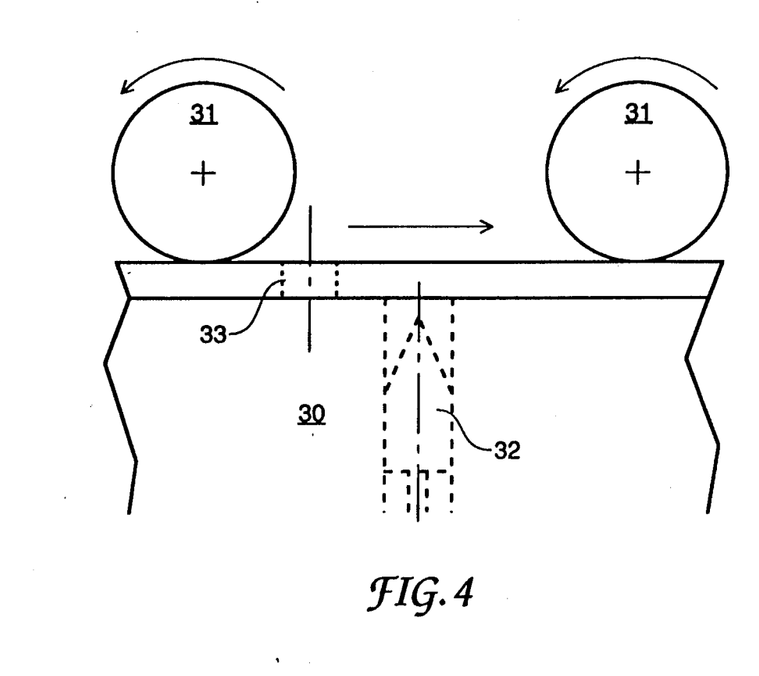
FIG. 4 is the front plan view of a lead frame showing the index rollers in contact and the guide pin mechanism in a retracted position.
Figure 5:
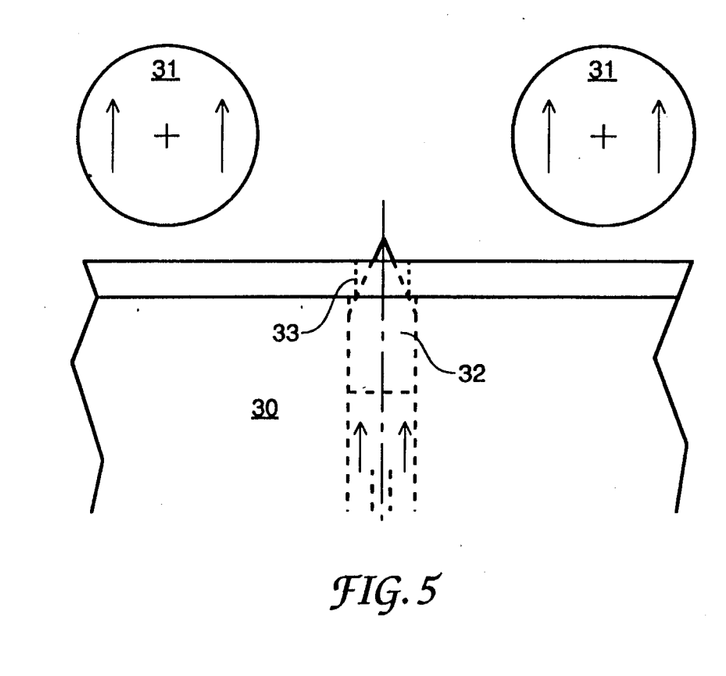
FIG. 5 is the front plan view of the lead frame showing the index rollers lifted and the guide pin in place.

In addition to having the vision system described above, the mechanical indexing system described in the prior art is refined in an obvious way, as shown in FIG. 4, and FIG. 5 and as described in the preferred embodiment. By this means the indexing precision and accuracy of both the die attach and wire bond process are significantly improved.

By having an integrated vision system to provide continuous, non-interfering optical verification and control of the physical relationships, the mechanical control of the elements to be processed (the lead frame, the film, and the die) is simplified and duplication of functions is eliminated. This results in a more tightly controlled process and a saving of time.

A further significant feature of the system is that by careful selection and control of the temperature zones the softness of the adhesive material can be more accurately controlled. The material can be softened for attachment to the lead frame without adhering to the tool, softened further for die attach without causing the die to "float", and stiffened for wire bonding without slipping out of position. Additionally, the physical proximity and fixed relationship of all of the process elements and the independent, continuous visual verification units prevent any substantial yield loss from occurring before processing is halted. This invention also reduces the number of indexing steps while allowing fewer inherent cumulative errors.

DESCRIPTION OF THE PREFERRED EMBODIMENT

Figure 3:
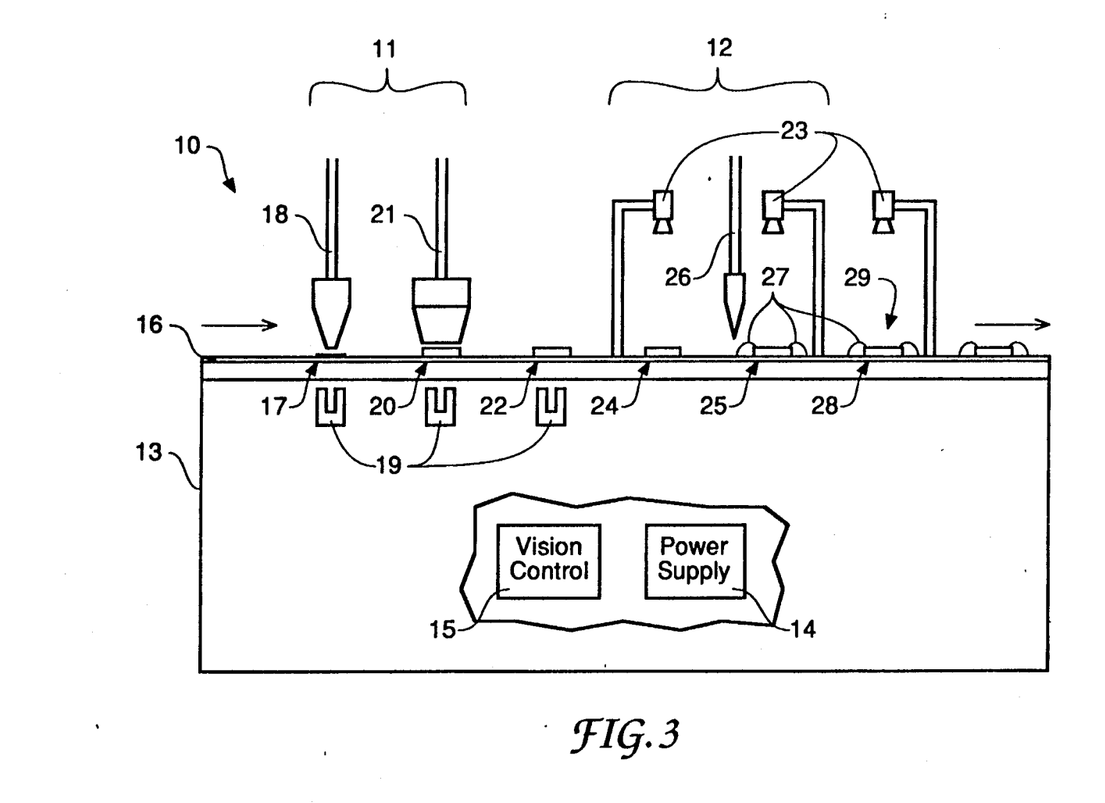
FIG. 3 is a partially cutaway schematic diagram of the integrated and combined die attach and lead bond processes forming the present invention, showing the die attach-wire bond combination of the preferred embodiment.

With reference now to the drawings and in particular to FIG. 3 thereof, a novel system of combining and integrating the die attach and lead bond processes used in the assembly of a semiconductor package will be described. The description embodies the principles and concepts of the present invention and is generally designated by the numeral 10.

A die attach machine 11 and the wire bond machine 12, are subsystems of the invention 10, are located physically adjacent to each other, with their top surfaces in horizontal planar relationship to each other.

The die attach machine is available as a model ESEC 2005W die attacher, manufactured by ESEC SA, Hinterbergstrasse 32, Cham, Switzerland. The wire bonder is available as a K & S Model 1484, from Kulicke and Soffa, at 2101 Blair Mill Road, Willow Grove, Pa.

These two machines are held in fixed relationship by a common, generally box-shaped metal framework 13 and use a common power supply 14 and vision control system 15 (each of known design). Furthermore, the die attach and wire bond machines share a common power driven, work holder means (not shown) on a continuous belt (not shown) to move the lead frames 16 along the horizontal plane common to both machines.

In commencing operation of the preferred embodiment, a lead frame (not shown) is indexed precisely, in a manner to be described and used throughout this invention, upon the first position 17 of the work holder means (not shown) of the die attach machine 11. Next a section of known polyimide material, precisely cut in a die shape, in a known manner and sandwiched in a known way, between an upper and lower layer of thermoplastic adhesive, is precisely pre-attached, in a known way, to the central area of the lead frame by a "pick and place" tool (not shown). The pick and place tool is part of the above-mentioned ESEC die attacher, and is located on an automatically controlled moving arm 18. The moving arm 18 is a subsystem of the above-mentioned die attacher. This die-shaped material may also be applied directly, in a known manner, by a punch mechanism (not shown) over or under the frame at the same location in the process. A thermode 19 (of known design) is used in a known manner to produce a controlled temperature, which causes a re-flow of the thermoplastic adhesive, thereby attaching the die-shaped section to the lead frame.

The lead frame 16, with the polyimide and thermoplastic material attached, is precisely and mechanically indexed to a second position 20. The semiconductor device (of known design) is then picked out of the array of the die that constitutes a wafer and is placed on the thermoplastic material in a known manner, as illustrated in die attach means 21. Alternatively, it may be placed on a "precising" mechanism which consists of two bars (not shown) for attachment, to the lead frame from beneath the frame. The precising mechanism is part of the ESEC die attacher. The temperature of the thermode 19 at this position is higher than at the previous position, thereby causing significant softening of the thermoplastic material.

The lead frame is again indexed to a third bonding position, known as the post die attach lamination station 22. Another thermode 19 is employed to securely laminate all of the elements together, effectively creating a single, uniformly structured semiconductor package (not shown). The heat and mechanical force are controlled as before, but with a different profile.

In conventional die attach machinery, and as used in this embodiment, the steps described above take place in close physical proximity, in a generally inclosed environment and are not amenable to convenient physical or visual inspection during operation of the machinery. At all subsequent process stages, to be described in this embodiment, a commercially available vision system is used to examine optically the integrity of the die attach process, define the relative position of the lead frame, the outer dimensions of the die, the metallized pattern of the circuitry, the movements at the wire bond stage and, the visible integrity of the final product.

In this embodiment the vision system includes a plurality of commercially available computer-controlled television cameras (CCTV) 23 (of known design) each of which is mounted, appropriately and independently of any moving stations of the die attach and wire bond processes. The plurality of CCTV cameras 23 uses a common power supply and subsystem memory of known design. One camera 23 is mounted in a position appropriate to view the process product 24 immediately following the post die attach lamination station. The information from this first camera verifies the integrity and position of the product and is transmitted to the bond head mechanism (of known design) and the indexing mechanism, for proper automatic, mechanical adjustment, and alignment of the product prior to the wire bond step.

For the wire bonding operation, the lead frame is indexed again to the fourth position 25 where a mechanical arm 26, known as an X, Y, Z motion bond head, of conventional design is positioned to attach fine wire 27, in a known manner, on the multiplicity of pads (not shown) on the die to the appropriate leads, not shown, on the lead frame. This operation is viewed by a second camera 23, which uses the information from the first camera 23 to correct, in a known manner, any displacement errors from the originally taught combination of die-to-lead frame dimensions.

After the wire bonding step is complete, the system indexes the lead frame and just-bonded device to a fifth station 28 where a third camera 23 compares the finished device 29 to a "recipe" of allowed positional displacements. If any displacements exceed known tolerances, processing is interrupted for corrections to be made. If no rejectable errors are found, the finished device is indexed to a carrier (not shown) and moved to the next process or to storage.

The mechanical indexing mechanism used generally in conventional die attach and wire bond machines has been described in the prior art. An obvious refinement and improvement of this mechanism, which is used throughout this embodiment and is not a novel part of this invention, may be seen by referring to FIG. 4 and FIG. 5.

In FIG. 4, multiple lead frames (not shown) carrying multiple semiconductor devices in various stages of completion are placed on carriers 30 which are advanced in a defined horizontal plane by rolling contact with multiple index rollers 31. These rollers are mounted in a parallel spaced relationship on a common horizontal axis, extending at right angles to the direction of travel of the carriers. The rollers are designed to be lowered and raised vertically and mechanically, to make and break rolling contact with the carriers, thus starting and stopping said carriers in a controllable way. The index rollers in this embodiment rotate in a direction opposite to the direction of travel of the multiple lead frame carriers.

When a carrier is stopped in a pre-determined position, it is indexed precisely by metal guide pins 32, which are first in a retracted position, below the planar surface of the carrier, as shown in FIG. 4, when the carrier is in motion. When the carrier is stopped as shown in FIG. 5 to position the device for a fabrication step, the multiple guide pin 32 is moved vertically up to engage with the multiple matching holes 33 in the multiple carriers. When so engaged, the conical point of the pin extends through the hole and above the planar surface of the carrier, with the cone surface in full contact with the bottom edge of the hole, thereby holding the carrier securely in position.

The present invention has been fully described in a preferred embodiment but, as noted above, many modifications, variations and additional applications may become apparent to those skilled in the art. However the scope of the present invention is not limited by the above described details but only by the terms of the appended claims.

We claim:

1. A unified and automatically controlled semiconductor device assembly and inspection system, said system comprising:

a) an existing automated material transport and work holding means, automated die attach means and automated lead bonding means, appropriately and operably and fixedly attached to each other on a common supporting frame means in such a way as to unify and coordinate, in a controlled and continuous manner, mechanical and electrical operations between said material transport and work holding means, said die attach means and said lead bonding means during assembly of said semiconductor devices;

b) said material transport and work holding means being of known design to provide common reference means for positional placement of said devices throughout said die attach and lead bonding operations and final inspection of said completed devices;
c) a common material position indexing means of known design, operably attachable to said common material transport and work holding means, in a known way, to enable precise and accurate positioning and placement of said semiconductor devices during their assembly and inspection;
d) an automated vision control means operably and independently attached to said die attach means in such a way as to observe and control said die attach operation;
e) an automated vision control means operably and independently attached to said lead bonding means in such a manner as to observe and control said lead bond operation and validate said previous die attach operation;
f) automated vision control means operably and independently attached to said assembly system in such a way as to observe and control completely assembled semiconductor devices; and
g) all of said automated vision control means operably interconnected to each other in such a manner as simultaneously to collect, store, coordinate and utilize all information received by each of said vision control means in order to validate all assembly operations and control, precisely and accurately, the assembly of said semiconductor devices.

2. The semiconductor device assembly and inspection system described in claim 1, wherein:
a) said automatic vision control means includes a computer controlled television camera of known design mounted statically and independently from the moving station of the known die attach means to observe and control the completed die attach operation;
b) said automatic vision control means includes a computer controlled television camera of known design mounted statically and independently from the moving station of the known lead bonding means to observe and control the entire lead bond operation and validate said previous completed die attach operation;
c) said automatic vision control means includes a computer controlled television camera of known design mounted statically and independently from the moving stations of the known die attach means and lead bonding means to observe and control completely assembled semiconductor devices; and
d) said plurality of automatic computer controlled television cameras are operably and electronically connected and programmed to each other in a known way in order to store and integrate and utilize common, available assembly process information and provide a common reference for the precise and accurate positional placement of the said devices and die and lead bonds throughout the assembly process and to inspect and evaluate and control the structural quality and integrity of the completely assembled semiconductor devices.

3. A unified and automatically controlled semiconductor device assembly and inspection system, said system comprising:
a) an existing automated leadframe die attach equipment and automated wire bonder operably attached to each other in such a way as to unify and coordinate mechanical and electrical operations between said die attach equipment and said wire bonder during assembly of semiconductor devices;
b) a common lead frame transport means of known design operably and fixedly attached to and between said die attach equipment and said wire bonder in such a way as to support and move said semiconductor devices in a controlled and continuous manner and serving to provide common reference for positional placement of said devices throughout said die attach and wirebond operations and final inspection of said completed devices;
c) a common lead frame position indexing means of known design operably attachable to said common lead frame transport means in a known manner to enable precise and accurate positioning and placement of said semiconductor devices during their assembly and inspection;
d) an automated vision control means operably and independently attachable to said die attach equipment in such a manner as to observe and control said die attach operation;
e) an automated vision control means operably and independently attached to said wire bonder in such a manner as to observe and control said wire bond operation and validate said previous die attach operation;
f) automated vision control means operably and independently attached to said assembly system in such a manner as to observe and control completely assembled semiconductor devices; and
g) all of said automated vision control means operably interconnected to each other in such a manner as simultaneously to collect, store, coordinate and utilize all information received by each of said vision control means in order to validate all assembly operations and control, precisely and accurately, the assembly of said semiconductor devices.

4. The semiconductor device assembly and inspection system described in claim 3, wherein:
a) said automatic vision control means includes a computer controlled television camera of known design mounted statically and independently from the moving station of the known die attach equipment to observe and control the completed die attach operation;
b) said automatic vision control means includes a computer controlled television camera of known design mounted statically and independently from the moving station of the known wire bonder to observe and control the entire wire bond operation and validate said previous completed die attach operation;
c) said automatic vision control means includes a computer controlled television camera of known design mounted statically and independently from the moving stations of the known die attach and wire bonder to observe and control completely assembled semiconductor devices; and
d) said plurality of automatic computer controlled television cameras are operably and electronically connected and programmed to each other in a known way in order to store and integrate and utilize common, available assembly process information and provide a common reference for the precise and accurate positional placement of the lead frames and die and wire bonds throughout the assembly process and to inspect and evaluate and control the structural quality and integrity of the completely assembled semiconductor devices.

5. The semiconductor device assembly and inspection system described in claim 1, wherein:
a) said existing automated material transport and work holding means is a tape and reel system of known design having a material supply housed on a large reel and an indexing system of known design to index, locate and hold the tape in preparation for appropriately integrated known die attachment and lead bonding;
b) said integrated die attachment and lead bonding is by known tape automated bonding means.

6. The semiconductor device assembly and inspection system described in claim 1, wherein:
a) said existing automated material transport and work holding means is a known carrier based means having an integrated indexing system designed for tape automated bonded devices that are bonded to tape in carriers in a known way;
b) said tape automated bonded devices are bonded to tape in carriers in a known way by known integrated means.

7. The semiconductor device assembly and inspection system described in claim 1, wherein:
a) said existing automated material transport and workholding means is a known printed circuit board holding and indexing system that provides for input and output storage of said devices in cassettes and a known locating system that prepares the printed circuit boards for integrated flip chip bonding;
b) said flip chip bonding is done by known means.

8. The semiconductor device assembly and inspection system described in claim 6, wherein:
the said carrier based means designed in a known way for flip chip bonding is also designed in a known way for interconnection in a known way through known Z-axis conductive anisotropic epoxy film.

9. The semiconductor device assembly and inspection system described in claim 7, wherein:
the said printed circuit board holding and indexing system is designed in a known way for use with a flip chip bonding and also designed in a known way for interconnection in a known way through known Z-axis conductive anisotropic epoxy film.

* * * * *